United States Patent
Sorensen et al.

(10) Patent No.: US 10,845,432 B2
(45) Date of Patent: Nov. 24, 2020

(54) CALIBRATION AND MONITORING FOR 3-AXIS MAGNETOMETER ARRAYS OF ARBITRARY GEOMETRY

(71) Applicant: The Charles Stark Draper Laboratory, Inc., Cambridge, MA (US)

(72) Inventors: Michael Sorensen, Woburn, MA (US); Philip Babcock, Westford, MA (US); Cort Johnson, Arlington, MA (US); Neil Sunil Patel, Cambridge, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 15/639,670

(22) Filed: Jun. 30, 2017

(65) Prior Publication Data
US 2018/0003777 A1 Jan. 4, 2018

Related U.S. Application Data

(60) Provisional application No. 62/356,591, filed on Jun. 30, 2016.

(51) Int. Cl.
*G01R 33/00* (2006.01)
*G01R 33/02* (2006.01)
(Continued)

(52) U.S. Cl.
CPC ..... *G01R 33/0023* (2013.01); *G01R 33/0035* (2013.01); *G01R 33/0206* (2013.01); *G01R 35/00* (2013.01); *G01N 27/82* (2013.01)

(58) Field of Classification Search
None
See application file for complete search history.

(56) References Cited

U.S. PATENT DOCUMENTS 5,134,369 A * 7/1992 Lo ............... G01R 33/0206
324/202
5,243,403 A * 9/1993 Koo ............... G01R 33/0327
250/227.19
(Continued)

FOREIGN PATENT DOCUMENTS

EP 0 756 179 A2 1/1997
WO 2015/179237 A1 11/2015
(Continued)

OTHER PUBLICATIONS

Cai Junping et al.; In-Field Practical Calibration of Three-Axis Magnetometers; Publication Date: 2010; The Institute of Navigation: 2010 International Technical Meeting (pp. 67-73). USA.*
(Continued)

*Primary Examiner* — Nasima Monsur
(74) *Attorney, Agent, or Firm* — HoustonHogle LLP (57) ABSTRACT

A system and method for calibrating rigid and non-rigid arrays of 3-axis magnetometers. Such arrays might be used to analyze structures containing ferromagnetic material. The calibration determines scale factor and bias parameters of each magnetometer in the array, and the relative orientation and position of each magnetometer in the array. Once the parameters are determined, the actual magnetic field value at the magnetometer location can be simply related to magnetometer measurements. The method and system can be used to calibrate an array of 3-axis magnetometers in aggregate as opposed to individual magnetometers. This is critical in large arrays to increasing reproducibility of the calibration procedure and decreasing time required to complete calibration procedure.

18 Claims, 6 Drawing Sheets

(51) Int. Cl.
*G01R 35/00* (2006.01)
*G01N 27/82* (2006.01)

(56) References Cited

U.S. PATENT DOCUMENTS

| | | | | |
|---|---|---|---|---|
| 5,642,045 | A * | 6/1997 | Keefe | G01R 33/022 |
| | | | | 324/225 |
| 6,130,534 | A | 10/2000 | Huang et al. | |
| 6,263,230 | B1 | 7/2001 | Haynor et al. | |
| 6,980,921 | B2 | 12/2005 | Anderson et al. | |
| 7,133,793 | B2 | 11/2006 | Ely et al. | |
| 7,451,549 | B1 | 11/2008 | Sodhi et al. | |
| 7,891,103 | B2 | 2/2011 | Mayor et al. | |
| 7,932,718 | B1 * | 4/2011 | Wiegert | G01V 3/081 |
| | | | | 324/245 |
| 9,743,370 | B2 | 8/2017 | Davis et al. | |
| 2004/0149004 | A1 | 8/2004 | Wu | |
| 2012/0074933 | A1 * | 3/2012 | Lee | G01L 3/102 |
| | | | | 324/244 |
| 2012/0086438 | A1 | 4/2012 | Tu | |
| 2012/0096921 | A1 * | 4/2012 | Almalki | G01C 17/38 |
| | | | | 73/1.76 |
| 2012/0206129 | A1 | 8/2012 | Mahan et al. | |
| 2013/0238268 | A1 * | 9/2013 | Sheng | G01R 33/0035 |
| | | | | 702/92 |
| 2014/0340089 | A1 * | 11/2014 | Rodney | G01V 3/40 |
| | | | | 324/346 |
| 2015/0145625 | A1 * | 5/2015 | Fukasawa | G01C 17/38 |
| | | | | 335/299 |
| 2015/0330946 | A1 | 11/2015 | Davis et al. | |
| 2016/0245737 | A1 | 8/2016 | Davis et al. | |
| 2016/0323839 | A1 | 11/2016 | Davis et al. | |
| 2016/0323841 | A1 | 11/2016 | Davis et al. | |
| 2017/0108469 | A1 | 4/2017 | Timmons et al. | |

FOREIGN PATENT DOCUMENTS

| | | |
|---|---|---|
| WO | 2016/175905 A1 | 11/2016 |
| WO | 2017/052712 A2 | 3/2017 |

OTHER PUBLICATIONS

Dorveaux, E. et al., "On-the-Field Calibration of an Array of Sensors," American Automatic Control Council, Proceedings of 2010 American Control Conference, pp. 6795-6802. Eight pages.

Farajidavar, A. et al., "A Comprehensive Method for Magnetic Sensor Calibration: A Precise System for 3-D Tracking of the Tongue Movements," 2012 Conference Proceedings, IEEE in Medicine and Biology Society, 2012. Thirteen pages.

"Helmholtz Coil Techniques for Producing High-Frequency AC Helmholtz Field," http://www.accelinstruments.com/Helmholtz-Coil/Helmholtz-Coil.html. Accessed on Jun. 27, 2017. Seven pages.

Hemanth, K.S. et al. "Calibration of 3-axis Magnetometers," IFAC Proceedings, No. 45.1, pp. 175-178, 2012. Four pages.

International Search Report and Written Opinion of the International Searching Authority, dated Oct. 19, 2017, from International Application No. PCT/US2017/040379, filed on Jun. 30, 2017. 14 pages.

Lassahn, M.P. et al., "Vectorial Calibration of 3D Magnetic Field Sensor Arrays," IEEE Transactions on Instrumentation and Measurement, vol. 44, No. 2, pp. 360-362, Apr. 1995. Three pages.

Magnetometer, VectorNav Library, VectorNav Embedded Navigation Solutions, downloaded from http://www.vectornav.com/support/library/magnetometer. Before Jun. 7, 2017. Four pages.

Tchernychev, M. et al., "Multiple Magnetometer Sensor Arrays and their Applications in Marine Environmental Surveys," Ocean News & Technology, May 2014. Nine pages.

Winer K. "Simple and Effective Magnetometer Calibration," downloaded from http://github.com/kriswiner/MPU6050/wiki/Simple-and-Effective-Magnetometer-Calibration. Mar. 10, 2016. Six pages.

International Preliminary Report on Patentability, dated Jan. 10, 2019, from International Application No. PCT/US2017/040379, filed on Jun. 30, 2017. 8 pages.

Afzal, M., "Use of Earth's Magnetic Field for Pedestrian Navigation," Ph.D. Thesis, University of Calgary Schulich School of Engineering, Canada, Jul. 2011. Two hundred forty-seven pages.

Ali, A. et al., "Swarm Optimization-Based Magnetometer Calibration for Personal Handheld Devices," Sensors, No. 12, pp. 12455-12472, 2012. Eighteen pages.

* cited by examiner

CALIBRATION AND MONITORING FOR 3-AXIS MAGNETOMETER ARRAYS OF ARBITRARY GEOMETRY

RELATED APPLICATIONS

This application claims the benefit under 35 USC 119(e) of U.S. Provisional Application No. 62/356,591, filed on Jun. 30, 2016 which is incorporated herein by reference in its entirety.

BACKGROUND OF THE INVENTION

Metal components of structures are susceptible to defects, such as due to imperfect manufacture, corrosion, fatigue, wear, damage, etc. To prevent catastrophic failure of such structures, metal components may be visually inspected to identify defects before a failure occurs. However, many structures are not easy to inspect due to being buried underground or under the sea, or due to being embedded within other materials such as concrete. For large structures containing metal components, such as bridges and tunnels, routine visual inspection may be impractical or too costly to perform.

Many ferromagnetic objects, including steel pipe, act as weak permanent magnets even when not intentionally magnetized; for example, magnetic dipoles in steel may partially orient to the Earth's magnetic field after cooling below the Curie temperature when cast or hot-rolled in the foundry. Magnetic fields present in ferromagnetic objects as stray byproducts of their manufacture are known herein as parasitic fields. The Earth's magnetic field also induces magnetic fields in ferromagnetic objects.

More recently, magnetic analysis systems for characterizing a ferromagnetic material have been proposed. For example, U.S. Publication No. 2017/0108469 describes a system that non-intrusively and non-destructively analyzes structures to determine characteristics including defects and non-defects, based its ferromagnetic material. That system uses magnetometers and a data processing module to detect and analyze parasitic magnetic fields of the structures.

Ferromagnetic materials of the structures exhibit magnetization based on shape, composition, and fabrication history. At the same time, non-ferromagnetic and other ferromagnetic material may create anomalies that perturb the magnetic field from ferromagnetic material. These anomalies disrupt an otherwise spatially regular magnetic field of ferromagnetic material. Examples include a weld or junction between segments of ferromagnetic material, an unintentional irregularity of cracked, missing or otherwise faulty ferromagnetic material (hereinafter called a "defect" and typically due to corrosion, fatigue, wear, damage or imperfect manufacture), or an intentionally-designed gap or opening.

There are known documented methods for calibrating single 3-axis magnetometers. For example, see U.S. Pat. No. 6,130,534 to Huang et al.; U.S. Pat. No. 7,451,549 to Sodhi et al.; U.S. Publication No. 2012/0086438 by Tu; and "Calibration of 3-axis Magnetometers," Hemanth, K. S. et al., IFAC Proceedings, Volume 45.1: 175-178, 2012.

SUMMARY OF THE INVENTION

The present invention concerns a system and method for calibrating rigid arrays of multiple 3-axis magnetometers as might be used to analyze structures containing ferromagnetic material. Calibration refers to determining scale factor, bias, relative position, and orientation of each magnetometer in the rigid array. Once the parameters are determined, actual magnetic field value at the magnetometer location can be simply related to magnetometer measurements. The method and system can be used to calibrate an array of 3-axis magnetometers in aggregate as opposed to individual magnetometers. This is critical to increasing reproducibility of the calibration procedure and decreasing time required to complete calibration procedure of a large array of magnetometers in which not only scale factor and bias must be found, but also position and orientation of each magnetometer.

The calibration method and system can be used to determine 3-axis magnetometer orientation in packaging with arbitrary geometries and account for packaging errors in both 3-axis magnetometer alignment and position. The approach even works with arrays in packaging with arbitrary curved 3D geometries. In particular, the positioning of magnetometers is determined relative to a reference point on the array. This enables the accurate determination of position and size of any objects detected or analyzed by the array. Furthermore, this will compensate for irregular geometry of the packaging that might introduce magnetometer spacing (position) errors that need to be accounted for when interpreting 3-axis magnetometer array readings.

The present method and system can also be used to determine sensor bias independent of background field by including the uniform background field as one of the fit parameters.

The present method and system further utilize a source of non-uniform magnetic fields within or near the array to determine magnetometer position information.

Moreover, the present method and system can also compensate for changes in magnetometer calibration parameters over time or notify users when re-calibration is necessary. Environmental factors may cause readings from 3-axis magnetometers to change over time. Consistency in readings allows comparisons of 3-axis magnetometer readings over extended periods of time, critical for detecting gradual changes.

In some embodiments, single or multi-axis Helmholtz coils are used in conjunction with a dipole magnet to create uniform and non-uniform magnetic fields. Non-uniformity of field (i.e., dependence of field on position) is a requirement to determine position of magnetometers in the array. Second, by applying appropriate combinations of currents to multi-axis Helmholtz coils, it is possible to calibrate scale factor, bias, and orientations without rotating the array. This is crucial for accurate calibration of arrays with arbitrary geometries.

In general, according to one aspect, the invention features a method for calibrating an array of 3-axis magnetometers. The method comprises detecting a uniform magnetic field at each of the 3-axis magnetometers for different orientations of the array relative to the magnetic field and calculating a scale factor and orientation for each axis of each magnetometer of the array.

In embodiments, the magnetic field is generated with at least one Helmholtz coil. The calculation of the magnetic field at each of the 3-axis magnetometers for each of the orientations should be based on the physical and electrical parameters of the at least one Helmholtz coil.

In general, according to another aspect, the invention features a system for calibrating an array of 3-axis magnetometers. The system comprises a uniform magnetic field generator for generating a uniform magnetic field for the array, a non-uniform magnetic field generator for generating a non-uniform magnetic field for the array, and a data analysis system for calculating a scale factor and orientation for each axis of each magnetometer of the array and for calculating a position for each magnetometer of the array.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: "includes", "comprises", "including" and/or "comprising", when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

In general, a system and associated methodology are disclosed for determining calibration parameters of an array of 3-axis magnetometers affixed to a package of arbitrary 3-dimensional geometry. It also compensates for changes in magnetometer array readings over extended periods of time. The calibration procedure is applicable for arbitrary array sizes, ranging from a 1×1 (single 3-axis magnetometer) to large, irregular shaped, 3-axis magnetometer arrays.

Figure 1:
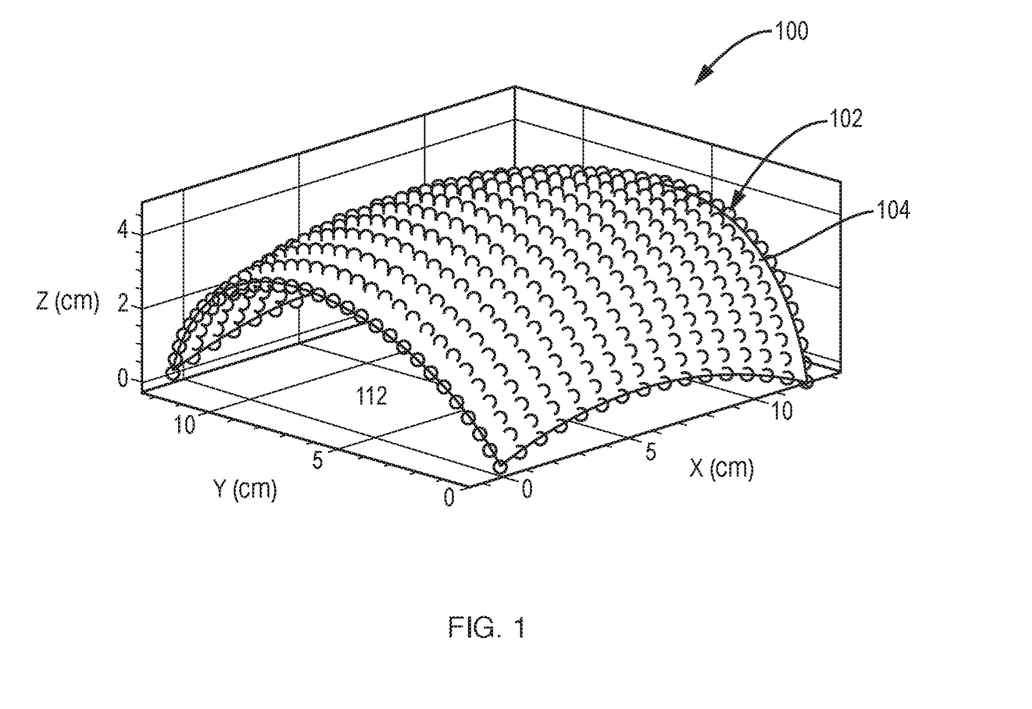
FIG. 1 is a schematic perspective diagram of a magnetic field mapping device comprising an array of 3-axis magnetometers.

FIG. 1 shows a magnetic analysis system 100 to which the present invention is applicable.

The magnetic analysis system includes an array of 3-axis magnetometers 112. A 3-axis magnetometer is capable of measuring the components of local magnetic fields of arbitrary orientation in three-dimensional (3D) space, along each of the three dimensional axes. The magnetic field value, which is a vector, can be projected into any 3D coordinate system to determine the three axial components.

Small variations of measurement of the magnetic field occur in each of the 3-axis magnetometers 112 due to manufacturing variability and/or defects even though each magnetometer is nominally the same (same brand and model) as any other magnetometer in the array. In order to obtain accurate readings from the magnetometer, calibration must be performed to determine precise scale factor and bias errors for each axis of the coordinate system for each 3-axis magnetometer 112.

Scale factor and bias are related to the slope and offset of a linear model that converts magnetometer measurements to magnetic field. Specifically:

Bias: In the presence of a magnetic field (B) oriented along one of the sensitive axes of a magnetometer, the measurement output (M) follows the expression $M=M_B+b$, where $M_B$ is the portion of the measurement proportional to magnetic field and b is the "bias". Concisely, when $B=0$, $M=b$.

Scale factor: Assuming the magnetic field is oriented along one of the sensitive axes of a magnetometer, the scale factor (S) converts changes in the measured signal into changes in magnetic field such that $B=S*M_B$. Alternatively, $\Delta B=S*\Delta M$ and $B=S*(M-b)$.

The 3-axis magnetometers 112 are arranged to form an array 102 of the 3-axis magnetometers 112. In general, the present system and method are relevant to the arrays having different shapes such as square, rectangular, circular, irregular or bent (normally shaped in 3D) in arbitrary ways and shapes. Positioned in an array, 3-axis magnetometer readings can be used in concert, yielding detailed information about magnetic material located nearby, and specifically its parasitic magnetic fields.

In the illustrated example, the array 102 comprises at least 50, and preferably over 100 three-axis magnetometers 112. (In the illustration, each of the circles corresponds to a separate 3-axis magnetometer 112.) In general, however, the number of magnetometers chosen for the array is application-specific.

The array 102 of magnetometers 112 is attached to or embedded within a package 104. Preferably the package 104 is highly rigid such that the relative position of the magnetometers 112 remains constant over time within the package 104. In this case, the calibration procedure yields not only scale factor and bias, but also the position and orientation of all magnetometers 112 in the array 102 which will remain constant over time. When the package 104 is not rigid, the calibration procedure can still be performed for all calibration parameters, but the position and orientation of the magnetometers 112 will not remain constant in the future due to the flexibility of the package 104. Therefore, for non-rigid packages 104 only the calibration of scale factor and bias will be accurate when using the array 102 in the future.

Concerning position, assuming that the magnetic analysis system has an associated reference frame (origin and three orthogonal axes), the "position" of a magnetometer is the magnetometer's physical location (x, y, z coordinates) in this reference frame.

Concerning orientation, assuming that the magnetic analysis system has an associated reference frame (origin and three orthogonal axes), the "orientation" of a magnetometer is the magnetometer's orientation relative to the axes of this reference frame. Specifically, the orientation is described by the projections of a magnetometer measurement axis onto the reference frame axes.

Moreover, in the current application, the package 104 and thus the shape of the array 102 take on a continuously curved shape. Specifically in the illustrated example, the array 102 is positioned or disposed across a top surface of the package 104. The package has a curved shape, such that vectors normal to its surface at the location of each magnetometer have different projections onto the X, Y, and Z axes.

In terms of size, the package is usually at least several centimeters long by several centimeters wide. The illustrated example the package is about 10 centimeters (cm) long and about 10 cm wide. However, in other examples, the package is over a meter long and over a meter wide. This is useful for analyzing the parasitic magnetic fields of larger ferromagnetic structures.

It is further noted that in addition to the manufacturing variability between magnetometers, there is also manufacturing variability in the package 104 and the attachment of the array 102 to the package. In short, additional manufacturing errors are almost always introduced when affixing a 3-axis magnetometer 112 to the rigid package 104 to form the array 102 of 3-axis magnetometers 112. To acquire precise measurements from the 3-axis magnetometer, the position and orientation of each 3-axis magnetometer 112 in the array 102 must be determined.

Figure 2:
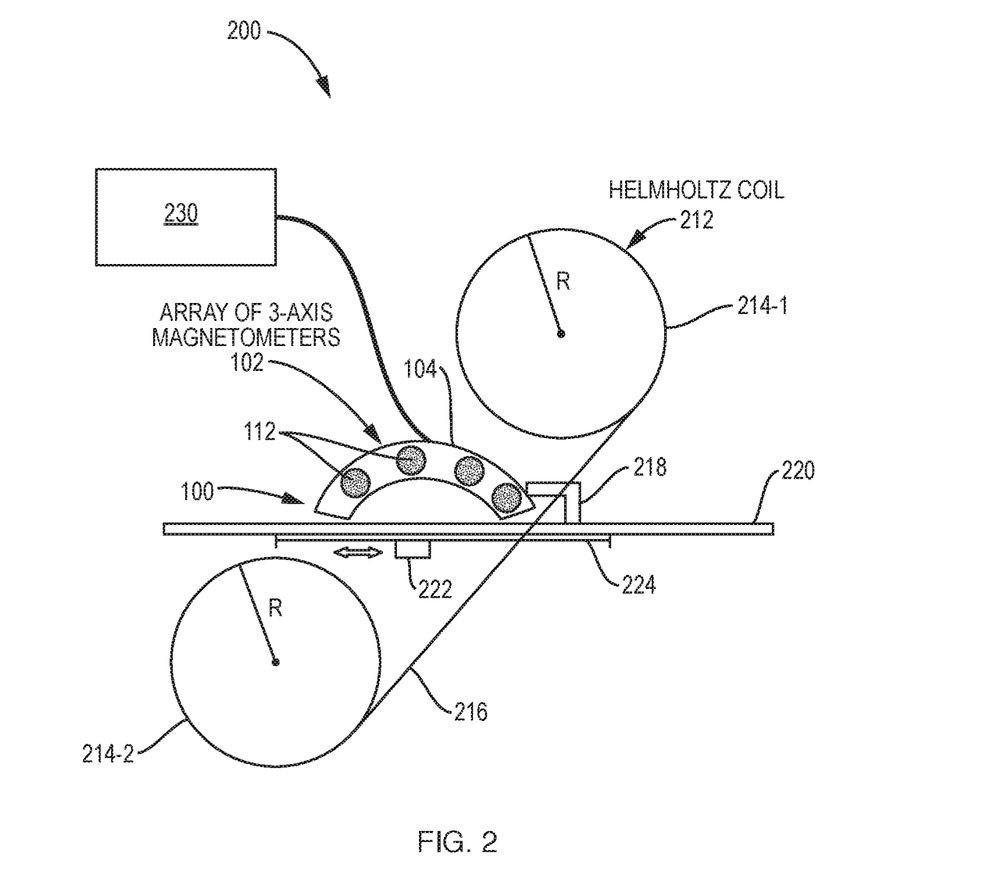
FIG. 2 is a schematic diagram of a calibration frame or jig for calibrating the array of 3-axis magnetometers.

FIG. 2 schematically shows a calibration system 200 containing a magnetic analysis system 100 attached to the calibration bench 220 of the system 200.

In general, the system 200 performs calibration of an array 102 of 3-axis magnetometers 112 affixed to rigid packaging 104. The system further includes a data analysis system 230 that reads the magnetic fields detected on each of the three axes of each of the 3-axis magnetometers 112 within the array 102 of the magnetic analysis system 100.

The calibration system 200 is used to determine scale factor, bias, and orientation of each 3-axis magnetometer 112 in the array 102 relative to a reference frame. The calibration system 200 then uses the 3-axis magnetometer calibration information to determine the precise position of each 3-axis magnetometer 112 in the array 102 by making use of a dipole magnet.

The calibration system 200 includes a Helmholtz coil system 212, which includes 2 identical coils 214-1, 214-2 of wire that are typically, but not necessarily, circular. Assuming a circular geometry, the coils 214-1, 214-2 are separated from each other by a distance equal to the radius R of the coils to achieve maximum field uniformity at the location of the magnetic analysis system 100. In more detail, in the illustrated schematic example, each of wire coils 214-1, 214-2 has the same radius R. Moreover, the wire coils 214-1, 214-2 are supported on a rigid coil arm 216. The length of the coil arm 216, l. equals radius, R.

When an electrical current is applied, the Helmholtz coil 212 generates a uniform magnetic field between the coils 214-1, 214-2 with strength and orientation given by $$B = (4/5)^{3/2} \left( \frac{\mu_0 n I}{R} \right) \cdot \vec{C}$$

where B is a vector indicating strength and direction of magnetic field, I is coil current, R is coil radius, n is the number of turns of the coil, $\mu_0$ is magnetic permeability between coils, and $\vec{C}$ is a vector describing the orientation of the Helmholtz coils.

The calibration system 200 further includes a reference frame. In one example, this can simply be a rigid table or optical bench 220 or other stable rigid support for the system 200. A mounting fixture 218 secures the magnetic analysis system 100 to the calibration bench 220.

In order to determine orientation of each of the magnetometer 112 affixed to the package 104 of the magnetic analysis system 100, the 3-axis magnetometer array 102 must be positioned in a stationary and repeatable way between wire coils 214-1, 214-2 of the Helmholtz coil 212. Measurements are taken with the coils 214-1, 214-2 in at least three (3) different orientations relative to the magnetic analysis system 100, rotating a single pair of coils on the coil arm 216 after each measurement. Alternatively, there may be three orthogonal Helmholtz coil pairs that can be used to apply arbitrary angles between the magnetic analysis system 100 and the applied field by varying the relative size of the currents applied to each Helmholtz coil pair.

The calibration system 200 further comprises a removable, permanent, dipole, magnet 222. This is moved relative to the calibration bench 220 and thus the magnetic analysis system 100 on a permanent magnet track 224 that is secured to the calibration bench 220. This permanent magnet 222 is used to determine the position of each magnetometer 112 in the package 104. Specifically, a dipole magnet 222 must be positioned in a known position relative to, and possibly below, the array 102 of 3-axis magnetometers 112.

Depending on the range of magnetic field values and size of the array 102 and the size of the rigid packaging 104, calibration readings are taken at multiple locations of the dipole magnet 222 on the track 224.

On the other hand, situations where more than one positioning of the dipole magnet are required include: the magnetic field saturating the magnetometers closest the dipole magnet and the magnetic field at the magnetometer becoming too weak to calibrate the 3-axis magnetometers furthest away.

Even without electrical current, dipole magnets will create a small, but noticeable magnetic field. Magnetic shielding or removal of these components when they are not being used is critical to reduce noise in measurements.

Figure 3:
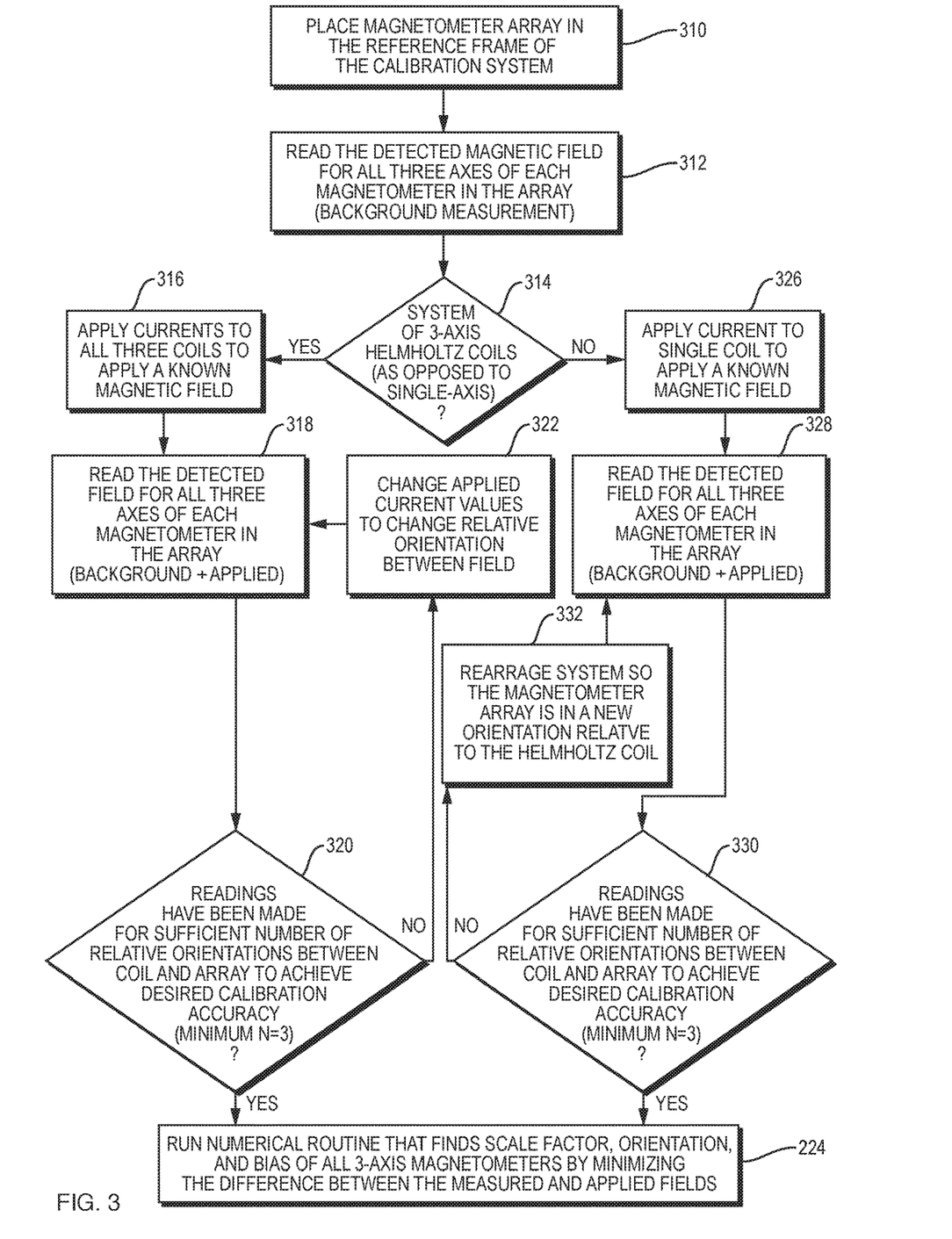
FIG. 3 is a flow diagram showing a method for determining a scale factor, bias and orientation of each 3-axis magnetometer in the array relative to a reference frame.

FIG. 3 shows the method for determining the orientation, scale factor and bias of all magnetometers 112 in an array 102 of the magnetic analysis system 100. In general terms, the array 102 is placed between the Helmholtz coils 212. Array 102 readings are taken with the Helmholtz coils 212 in different orientations relative to the array. The magnetic fields with known strength and direction, produced by the Helmholtz coils 212 can be compared against magnetometer readings to determine scale factor and orientation.

In a first step 310 magnetic analysis system is secured to the calibration bench 220 using the mounting fixture 218.

Then, in step 312, the data analysis system 230 interrogates the magnetic field readings on each of the three axes of each of the 3-axis magnetometers 112 of the array 102. This provides a background measurement. It allows the calibration to compensate for the Earth's magnetic field and other magnetic fields that are stable over the course of the calibration operation.

In step 314, the process flow branches based on the type of calibration system 200 that is used.

In the case where a single-axis Helmholtz coil 212 is used, in step 326, current is applied to that Helmholtz coil 212 to apply a known magnetic field to the magnetic analysis system 100 on the calibration bench 220.

Then in step 328, the data analysis system 230 reads the detected magnetic field for each of the three axes of each magnetometer 212 of the array 102. This detected magnetic field includes the magnetic field that is applied by the energized Helmholtz coil 212 and the background magnetic field.

In step 330, the number of readings acquired by the data analysis system 230 is determined. As a general rule, the magnetic field generated by the Helmholtz coil 212 must be detected for several angles of the Helmholtz coil 212 relative to the magnetic analysis system 100 held on the calibration bench 220. Generally, a minimum of three readings are made, but additional readings yield a more accurate calibration. As a result, in the next step 332, the calibration system is rearranged so that the magnetic analysis system 100 has a different orientation relative to the Helmholtz coil 212. In a typical embodiment, the Helmholtz coil 212 and specifically the coil arm 216 is rotated 90° on the calibration bench 220.

Then, in step 328, the data analysis system 230 again reads the magnetic fields detected by each of the magnetometers 112 within the array 102. Then steps 330 and 332 are again repeated. In each case, the Helmholtz coil is rotated to a new angle. In one example, the Helmholtz coil and specifically the coil arm 216 is rotated 90° in a different dimension.

On the other hand, if in step 314 it is determined that a set of 3-axis Helmholtz coils is used, in step 316, currents are applied simultaneously to all three of the Helmholtz coils to generate a known magnetic field in step 316. The relative values of the applied currents determine the relative angle between the applied field and the magnetic analysis system 100

Then in step 318, the detected magnetic field for each axis of each of the magnetometers 112 within the array 102 are read by the data analysis system 230. Here again, the detected magnetic field includes the magnetic field applied by the Helmholtz coil and any background magnetic field.

In step 320 it is determined whether the readings for a sufficient number of relative orientations between the array 102 and magnetic field generated by the three axis Helmholtz coils have been collected. In the first pass through the method, step 322 is performed where the applied current to the three axis Helmholtz coils is changed to thereby change the applied magnetic field. Then, steps 318, 320, and 322 are performed at least one more time, and preferably two or more times to improve accuracy, so that the data analysis system 230 can obtain the magnetic field readings for each of the magnetometers for each of the different orientations of the net applied magnetic field to array 102.

Finally, in step 224, the data analysis system 230 runs a numerical routine that finds the scale factor, orientation, and bias for all three axes of all of the magnetometers 112. This numerical routine seeks to minimize the difference between the measured and the applied fields for each of the magnetometers 112 within the array 102, e.g., by using a least-squares optimization procedure.

In more detail, calibration for each component of the 3-axis magnetometers 112 in the array 102 is achieved according to the following procedure: Assume the calibration bench 220 to which the magnetic analysis system 100 is mounted defines a laboratory reference frame with x, y, and z axes. The measured field components by the magnetometers 112 in the array 102 are not aligned with the lab reference frame. The actual applied field in the lab reference frame is modeled as a summation over the three sensor components of a single 3-axis magnetometer 112. For example, the x component of the field in the lab frame ($B_{L_x}$) is:

$$B_{L_x} = \Sigma_c (S_c * (M_c - b_c)) * \vec{O}_c \cdot \vec{L}_x, \text{ where}$$

$S_c$=scale factor the component $M_c$=uncalibrated measurement output of the component $b_c$=bias of the component $\vec{O}_c$=unit vector oriented along the c component $\vec{L}_x$=unit vector oriented along the lab frame X direction $\vec{O}_c \cdot \vec{L}_x$=projection factor for the c component onto the X axis of the lab frame $B_{L_x}$ includes both the applied $B_{L_{x,a}}$ and background $B_{L_{x,b}}$ fields. Sensor scale factor and orientations are found by minimizing the difference between fields applied in the lab and fields modeled from array measurements according to the following procedure. For each measurement with the array 328, the background measurement 312 is subtracted off, which removes both background field $B_{L_{x,bg}}$ and $b_c$ from the measurements. The difference between the applied field and the modeled field are calculated: $\vec{\Delta}_1 = \vec{B}_{La1} - \vec{B}_{Lm1}$ $\vec{B}_{La1}$=Vector magnetic field applied (in lab frame) during measurement 328

$\vec{B}_{Lm1}$=Vector magnetic field model (in lab frame) based on sensor output during measurement 328

The errors from the N individual measurements are combined $\Delta_{tot} = \Sigma_1^N \|\vec{\Delta}_1\|^2$, where $\|\vec{\Delta}_1\|$=the norm of the error vector for a single measurement and $\Delta_{tot}$ is minimized via a nonlinear least squares fitting routine to solve for 3-axis magnetometer 112 scale factor and orientation parameters $S_c$, $\vec{O}_c \cdot \vec{L}_x$, $\vec{O}_c \cdot \vec{L}_y$, $\vec{O}_c \cdot \vec{L}_z$. Once scale factor and orientation parameters are found, they are treated as known parameters and the minimization routine is re-run using background 312 and array measurements 328 without background subtraction to solve for a global background field and the individual 3-axis magnetometer 112 biases.

Figure 4:
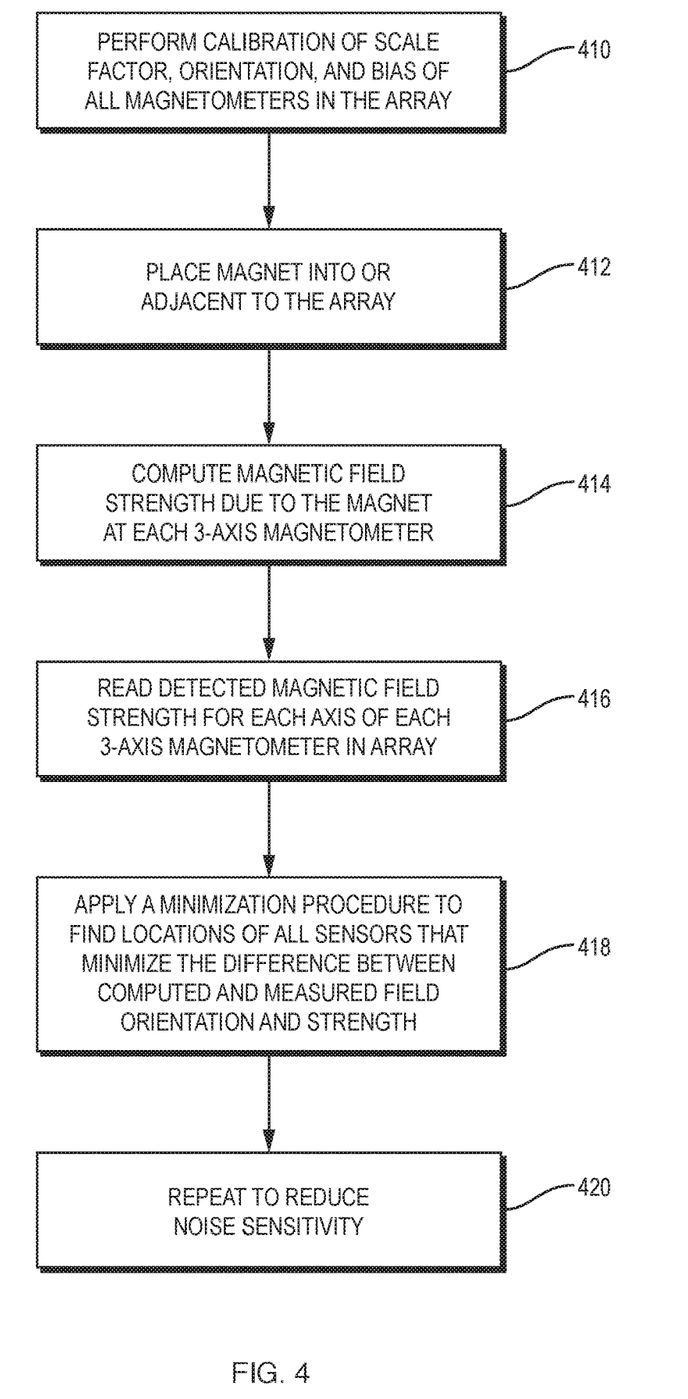
FIG. 4 is a flow diagram showing a method for using the orientation information for each of the 3-axis magnetometer to determine the position of each 3-axis magnetometer in the array of the device.

FIG. 4 shows the method for determining position of 3-axis magnetometer 112 in the array 102 and the magnetic analysis system 100.

The dipole magnet 222 is used to generate a magnetic field with non-uniform shape. For a permanent magnet of length 2a (along x-axis), width 2b (along y-axis), and height 2c (along z-axis), the strength and direction for a magnetic field at a point in 3-D space defined by x, y and z, with coordinate system located at the center of the dipole magnet bar, is given by the non-linear equations:

$$B_x = \frac{B_r}{4\pi}\left[\arctan\left(\frac{(y-b)(z-c)}{(x-a)\sqrt{(x-a)^2+(y-b)^2+(z-c)^2}}\right)-\right.$$

$$\arctan\left(\frac{(y-b)(z+c)}{(x-a)\sqrt{(x-a)^2+(y-b)^2+(z+c)^2}}\right)-$$

$$\arctan\left(\frac{(y+b)(z-c)}{(x-a)\sqrt{(x-a)^2+(y+b)^2+(z-c)^2}}\right)+$$

$$\arctan\left(\frac{(y+b)(z+c)}{(x-a)\sqrt{(x-a)^2+(y+b)^2+(z+c)^2}}\right)+$$

$$\arctan\left(\frac{(y+b)(z-c)}{(x+a)\sqrt{(x+a)^2+(y+b)^2+(z-c)^2}}\right)-$$

$$\arctan\left(\frac{(y+b)(z+c)}{(x+a)\sqrt{(x+a)^2+(y+b)^2+(z+c)^2}}\right)-$$

$$\arctan\left(\frac{(y-b)(z-c)}{(x+a)\sqrt{(x+a)^2+(y-b)^2+(z-c)^2}}\right)+$$

$$\left.\arctan\left(\frac{(y-b)(z+c)}{(x+a)\sqrt{(x+a)^2+(y-b)^2+(z+c)^2}}\right)\right]$$

$$B_y = \frac{B_r}{4\pi}\left[\ln\left(\frac{\sqrt{(x-a)^2+(y-b)^2+(z-c)^2}-(z-c)}{\sqrt{(x-a)^2+(y-b)^2+(z+c)^2}-(z+c)}\right)-\right.$$

$$\ln\left(\frac{\sqrt{(x-a)^2+(y+b)^2+(z-c)^2}-(z-c)}{\sqrt{(x-a)^2+(y+b)^2+(z+c)^2}-(z+c)}\right)-$$

$$\ln\left(\frac{\sqrt{(x+a)^2+(y-b)^2+(z-c)^2}-(z-c)}{\sqrt{(x+a)^2+(y-b)^2+(z+c)^2}-(z+c)}\right)+$$

$$\left.\ln\left(\frac{\sqrt{(x+a)^2+(y+b)^2+(z-c)^2}-(z-c)}{\sqrt{(x+a)^2+(y+b)^2+(z+c)^2}-(z+c)}\right)\right]$$

$$B_z = \frac{B_r}{4\pi}\left[\ln\left(\frac{\sqrt{(x-a)^2+(y-b)^2+(z-c)^2}-(y-b)}{\sqrt{(x-a)^2+(y+b)^2+(z-c)^2}-(y+b)}\right)-\right.$$

$$\ln\left(\frac{\sqrt{(x-a)^2+(y-b)^2+(z+c)^2}-(y-b)}{\sqrt{(x-a)^2+(y+b)^2+(z+c)^2}-(y+b)}\right)-$$

$$\ln\left(\frac{\sqrt{(x+a)^2+(y-b)^2+(z-c)^2}-(y-b)}{\sqrt{(x+a)^2+(y+b)^2+(z-c)^2}-(y+b)}\right)+$$

$$\left.\ln\left(\frac{\sqrt{(x+a)^2+(y-b)^2+(z+c)^2}-(y-b)}{\sqrt{(x+a)^2+(y+b)^2+(z+c)^2}-(y+b)}\right)\right]$$

At each 3-axis magnetometer in the array, the strength and direction of magnetic field from the magnet 222 is measured.

In more detail, as illustrated in step 410, the determination of the location of the magnetometers 112 within the array 102 relies on the previously determined calibration of the scale, factor, orientation, and bias all of the magnetometers 112 within the array 102 of the magnetic analysis system 100.

In step 412, the magnet 222 is placed into or adjacent to the array 102 of the magnetometers 112. The data analysis system 230 then computes the magnetic field strength due to the magnet 222 at each three axis magnetometer 112 within the array 102 in step 414 by using the formulas above.

Then, the data analysis system 230 reads the detected magnetic field strength for each axis of each 3-axis magnetometer 212 of the array 102.

Then in step 418, a minimization procedure is performed to find the locations of all of the magnetometers 112 that minimize the difference between the computed and measured field orientation and strength. In more detail, minimization procedure can be applied to minimize the difference of the computed strength of the magnetic field at a given location (a function of position) and the measured strength and orientation of the known magnetic field over the position parameters. Only one (i.e. a single orientation of the array in the known field) measurement is required to produce a result, however additional measurements can be made to reduce sensitivity to noise in magnetometer readings. The equation is shown below:

$$\min_{x,y,z} \sum_{k=1}^{n} \sqrt{(B_x - \tilde{B}_x(x,y,z))^2 + (B_y - \tilde{B}_y(x,y,z))^2 + (B_z - \tilde{B}_z(x,y,z))^2}$$

Here in is the number of magnetometers in the array whose position needs to be determined. $B_x$ is the measured magnetic field component; similarly for $B_y$, $B_z$. $\tilde{B}_x$ is the computed magnetic field component, as a function of position; similarly for $\tilde{B}_y$, $\tilde{B}_z$. To avoid a clutter of subscripts, the index k is omitted from the sum where for k denotes a magnetometer.

Constraints to the optimization routine may be added to ensure accuracy. For example knowledge of the relative position of the dipole relative to the 3-axis magnetometer array can be used to constrain x, y and z to be positive.

Figure 5:
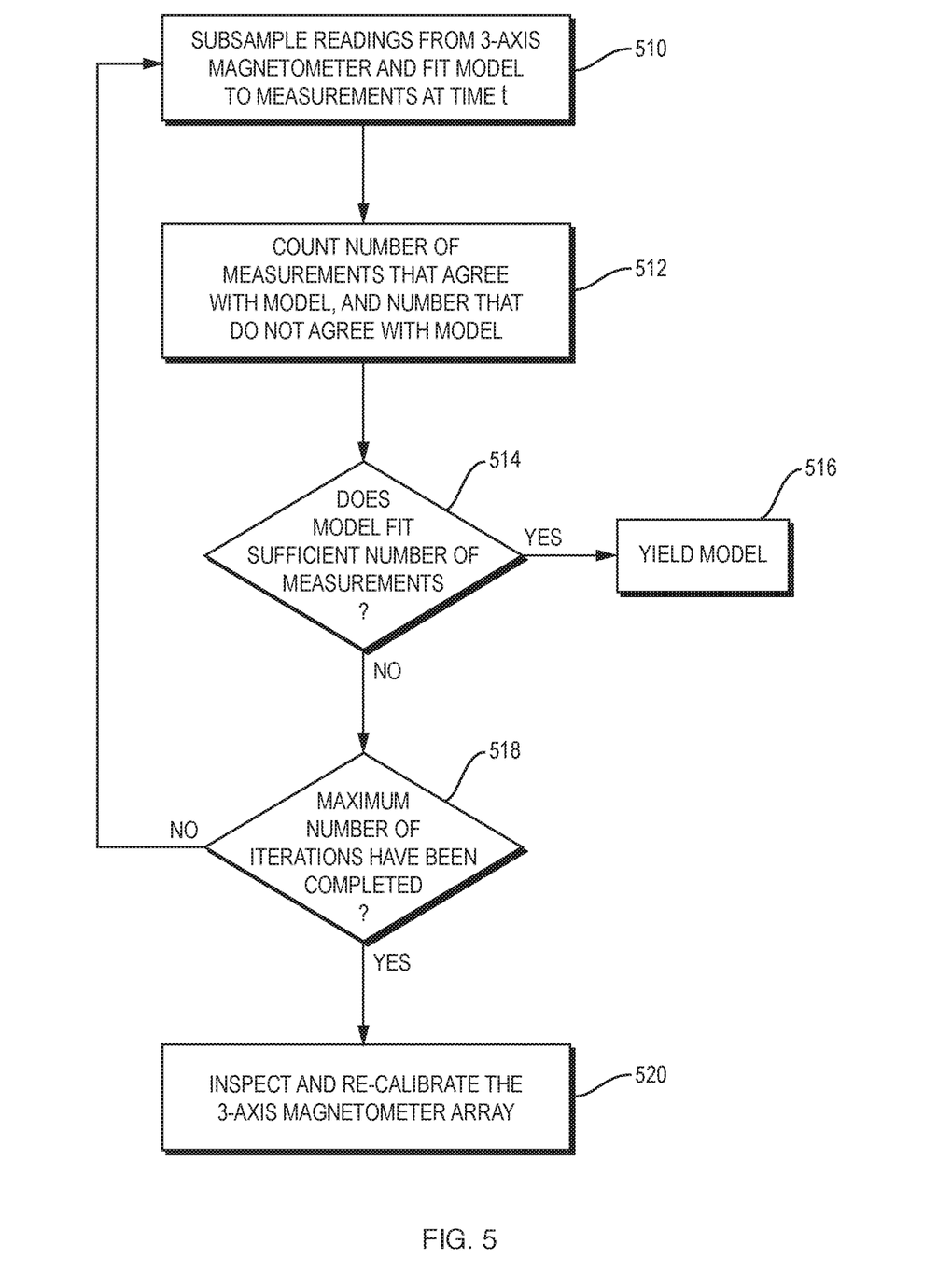
FIG. 5 is a flow diagram showing a method for monitoring the array for changes in calibration parameters over time.

FIG. 5 provides a method for the continuous monitoring of sensor array 102 to assess drift in calibration parameters.

Over time, measurements from the array 102 of 3-axis magnetometers 112 may change. Reasons for changes in measurements may include environmental factors, changes in material being measured, sensor deterioration, and sensor malfunction. At each reading, measurements from various 3-axis magnetometers 112 in the array 102 of the magnetic analysis system 100 can be checked for consistency, to determine if readings from the magnetometers may have changed over time.

This process requires a model, f, for evolution of sensor measurements at discrete times. The measurement at time t ($M_t$) are a function of environmentals at time t ($E_t$), measurements at a preceding time ($M_{t-1}$), and environmentals at a preceding time ($E_{t-1}$), i.e. $M_t = f(E_t, M_{t-1}, E_{t-1})$. By obvious extension, $M_t$ depends on measurements and environmentals at all previous times.

In more detail, the data analysis system 230 subsamples readings from magnetometers 112 and fits the model to the measurements at time t in step 510.

Then in step 512, the data analysis system 230 makes a count of the number of measurements that agree with model within a statistical uncertainty and the number that do not agree with model.

In step 514, the data analysis system 230 determines if the model fits a sufficient number of measurements. If there is agreement, then the method stops and the model is accepted in step 516. It then is applied as a correction factor to all readings from all magnetometers.

If there is not agreement between the model and the measurements, steps 510, 512, and 514 are performed again for a potentially a maximum number of iterations in step 518 to try to have the model converge in step 516.

If the model fails converge, then the data analysis system 230 indicates that the magnetic analysis system 100 and specifically the array 102 of magnetometers 112 should be inspected and recalibrated in step 520.

The sampling procedure allows the process to determine environmental parameters, even when causal changes in the magnetic field appear near a portion of the array 102 of 3-axis magnetometers 112.

As an example, take a simple model where temperature has a linear effect on measurements. Assume the array 102 of 3-axis magnetometers 112 is a 10×10 square (100 magnetometers). Other environmental parameters are assumed constant. The model can be described by the equation below:

$$M_t = f(T_t, M_{t-1}, T_{t-1}) = M_{t-1} + S(T_{t-1} - T_t) + b$$

Here S and b are model parameter vectors with i-, j- and k-components; $M_t$, $M_{t-1}$ are vectors representing measurements 3-axis magnetometer; $T_{t-1}$ and $T_t$ are scalar temperature measurements at the location of the 3-axis magnetometer at the nearest previous time (t−1) and the time (t) of the most recent measurement.

Intuitively, S describes how quickly the sensors change with temperature with respect to each component. b is a bias vector that contains values close to 0 for reliable sensors.

Figure 6:
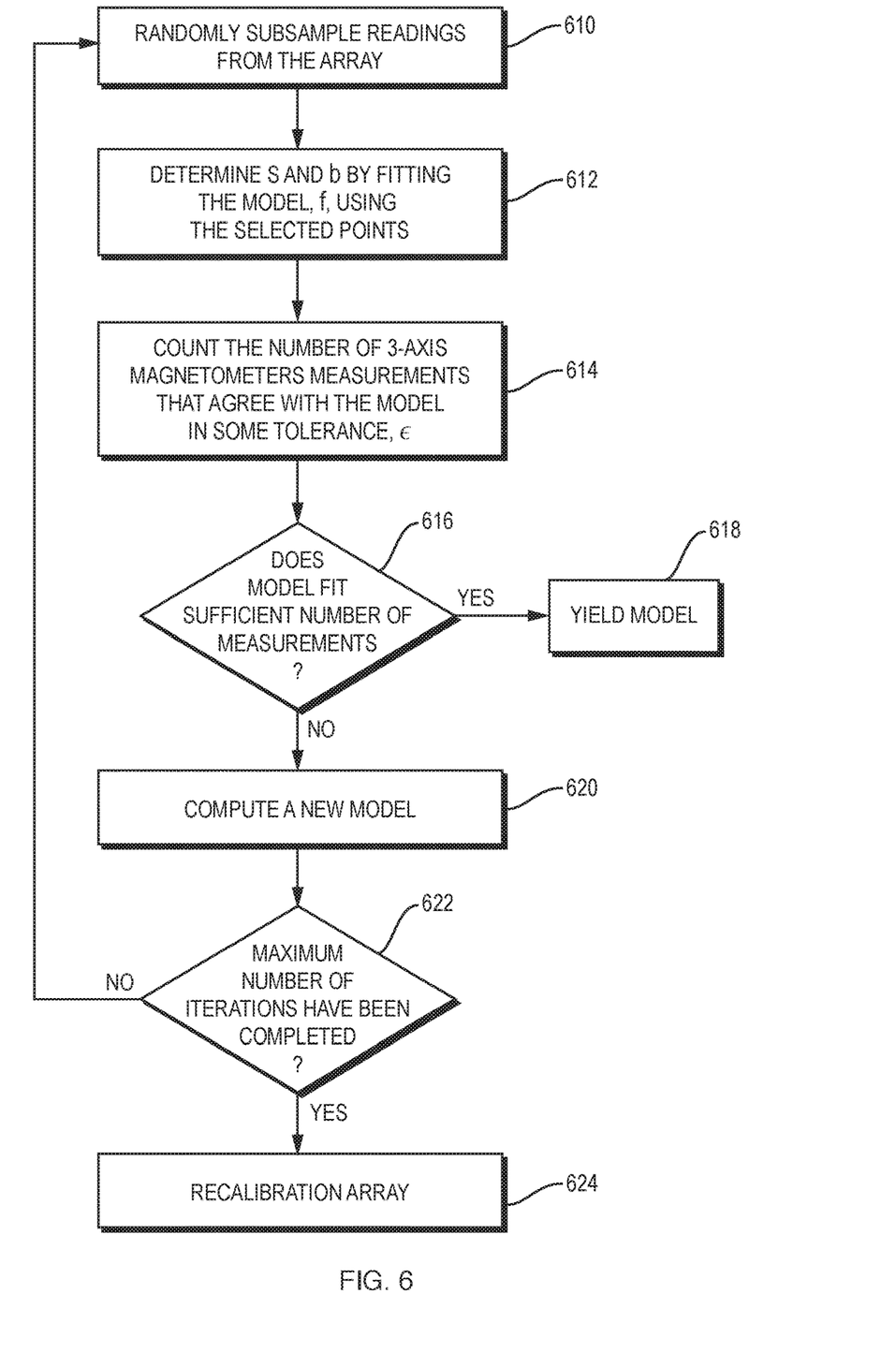
FIG. 6 is a flow diagram showing another method for monitoring the array for changes in calibration parameters over time.

FIG. 6 provides a method for the continuous monitoring of sensor array 102 for the case of this temperature model. The process would be as follows.

In step 610, the data analysis system 230 randomly subsamples 20 of the 100 readings from the array 102 of 3-axis magnetometers 112.

In step 612, the data analysis system 230 determines S and b by fitting the model, f, using the selected points. The model is linear so that linear least squares regression may be used.

Then, in step 614, the data analysis system 230 counts the number of 3-axis magnetometer measurements that agree with the model in some tolerance, ∈. In this example, $|M_t - (M_{t-1} + S(t_{t-1} - t_t) + b)| < \epsilon$. Appropriate values for c depend on the sensitivity of the 3-axis magnetometers.

In step 616 it is then determined whether the model fits a sufficient number of measurements. For example, it could be decided that if the number of measurements that agree exceeds 75 of the 100 measurements, the model is accepted. S and b accurately describe the effect of temperature on sensor readings. Thus, the model is yielded in step 618.

In the alternative, however, the data analysis system 230 computes a new model in step 620. Then steps 610, 612, 614, 616, and 620 are performed again. In each pass through this step, the new model is tested against the readings from the magnetometers 212. Seeking to yield a valid model in step 618.

If this process fails, and the maximum number of iterations (e.g., 10) have been completed in step 622, then the data analysis system 230 indicates that the array 102 of the magnetic analysis system 100 should be recalibrated in step 624 because the sensor array 102 measurements vary substantially from expectations. At this point corrective action should be taken. The array of 3-axis magnetometers may be inspected for defects and recalibrated.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system for calibrating an array of 3-axis magnetometers in a package, the system comprising:
   a uniform magnetic field generator comprising at least one Helmholtz coil for generating a uniform magnetic field for the array;
   a non-uniform magnetic field generator for generating a non-uniform magnetic field across at least part of the array; and
   a data analysis system for reading out measured signals from each of the magnetometers for different orientations of the array relative to the uniform magnetic field, calculating a scale factor for each axis of each magnetometer of the array; wherein each measured signal includes signals from the uniform magnetic field and a background magnetic field; and wherein the scale factor converts changes in measured signals into changes in the generated magnetic field; for reading out measured signals from each of the magnetometers for different orientations of the array relative to the non-uniform magnetic field at each of the 3-axis magnetometers, and determining a position of each of the magnetometers in the package based on the detected non-uniform magnetic field to account for manufacturing variability in the package.

2. The system according to claim 1, wherein the data analysis system determines bias in the measured signals from the magnetometers.

3. The system according to claim 1, wherein the data analysis system determines orientation of the magnetometers.

4. The system according to claim 1, wherein the data analysis system determines the magnetic field at each of the 3-axis magnetometers for each of the orientations based on the physical and electrical parameters of the at least one Helmholtz coil.

5. The system according to claim 1, wherein the non-uniform magnetic field generator comprises a permanent magnet near or within the array.

6. The system according to claim 1, wherein the data analysis system reads out the measured signals to measure the background magnetic field with the array of 3-axis magnetometers in absence of the uniform magnetic field, and compensates for the background magnetic field.

7. The system according to claim 1, wherein the uniform magnetic field generator comprises a three-axis Helmholtz coil.

8. A method for calibrating an array of 3-axis magnetometers, the method comprising:
   putting the array of 3-axis magnetometers into a package;
   generating a uniform magnetic field with at least one Helmholtz coil;
   measuring a signal at each of the 3-axis magnetometers for different orientations of the array relative to the uniform magnetic field; wherein each measured signal includes signals from the uniform magnetic field and a background magnetic field;
   calculating scale factor for each axis of each magnetometer of the array; where the scale factor converts changes in measured signals into changes in the generated magnetic field;
   generating a non-uniform magnetic field across at least part of the array;
   detecting the non-uniform magnetic field at each of the 3-axis magnetometers; and
   determining a position of each of the magnetometers in the package based on the detected non-uniform magnetic field to account for manufacturing variability in the package.

9. A method according to claim 8, further comprising determining bias in the measured signals from the magnetometers.

10. A method according to claim 8, further comprising determining orientation of the magnetometers.

11. A method according to claim 8, further comprising calculating the magnetic field at each of the 3-axis magnetometers for each of the orientations based on the physical and electrical parameters of the at least one Helmholtz coil.

12. The method according to claim 8, wherein generating the non-uniform magnetic field comprises locating a permanent magnet near or within the array.

13. A method according to claim 8, further comprising measuring the background magnetic field with the array of 3-axis magnetometers in absence of the uniform magnetic field, and compensating for the background magnetic field.

14. A method according to claim 8, further comprising generating the uniform magnetic field with a three-axis Helmholtz coil.

15. A method according to claim 8, further comprising subsampling magnetometers of the array and determining whether measurements agree with a model based on the scale factors and recalibrating the array if the measurements do not agree with the model.

16. The method according to claim 15, further comprising calculating a new model and determining whether the scale factors agree with the new model.

17. The method according to claim 8, further comprising determining the scale factors and orientations of all the magnetometers by minimizing a difference between a modeled magnetic field and the magnetic field applied by the Helmholtz coil; wherein the modeled magnetic field is determined from the measured signals with background signals subtracted off.

18. The method according to claim 17, further comprising determining biases for the magnetometers by using the determined scale factors and orientations as known parameters, and repeating the minimizing step using measured background signals and measured magnetometer signals without subtracting off the background signals.

* * * * *